United States Patent [19]

Furutani et al.

[11] Patent Number: 5,177,708
[45] Date of Patent: Jan. 5, 1993

[54] DYNAMIC RANDOM ACCESS MEMORY AND METHOD FOR EQUALIZING SENSE AMPLIFIER DRIVE SIGNAL LINES

[75] Inventors: Kiyohiro Furutani; Koichiro Mashiko, both of Hyogo, Japan

[73] Assignee: Mitsubishi Denki Kabushiki Kaisha, Tokyo, Japan

[21] Appl. No.: 260,132

[22] Filed: Oct. 19, 1988

Related U.S. Application Data

[63] Continuation of Ser. No. 924,564, Oct. 28, 1986, abandoned.

[30] Foreign Application Priority Data

Oct. 30, 1985 [JP] Japan .................. 60-245544

[51] Int. Cl.[5] .......................................... G11C 11/407
[52] U.S. Cl. ....................................... 365/203; 365/205
[58] Field of Search ............... 365/189, 190, 203, 205, 365/207, 208, 189.06, 189.11, 233

[56] References Cited

U.S. PATENT DOCUMENTS 4,443,868  4/1984  Takemae ........................... 365/203
4,608,670  8/1986  Duvvury et al. ................. 365/205
4,780,850  11/1987  Miyamoto et al. ........... 365/189.09

OTHER PUBLICATIONS

"A 256Kb CMOS Pseudo SRAM", Hiroshi Kawamoto et al., 1984 IEEE Int'l Solid State Conf., Digest of Technical Papers, Feb. 24, 1984, pp. 276–277.
"FAM 18.4: A Sub 100ns 256K DRAM in CMOS III Technology", Roger I. Kung et al., IEEE International Solid-State Circuits Conference, Feb. 1984, pp. 278–278 & 354, Digest of Technical Papers.
IECE Japan National Conference Proceedings, p. 2-205, THPM 439.
"A 64Kbit MOS RAM", Hisanori Yoshimura et al., IEEE International Solid-State Circuits Conference, Feb. 1978, pp. 148–149, Digest of Technical Papers.
"A 64K MOS RAM Design", N. Ieda et al., 9th Conference on Solid State Devices, Tokyo, 1977; Japanese Journal of Applied Physics, vol. 17 (1978).
"Simplified Peripheral Circuits for a Marginally Testable 4K RAM", Richard Foss et al., IEEE International Solid-State Circuits Conference, Feb. 1975, pp. 102–103, Digest of Technical Papers.

Primary Examiner—G. A. Gossage
Attorney, Agent, or Firm—Lowe, Price, LeBlanc & Becker

[57] ABSTRACT

In a dynamic random access memory (DRAM) having a sense amplifier of complementary metal oxide semiconductor (CMOS) type, switching transistors are provided for setting the bit line potential and the potential of the sense amplifier driving signal line at the same potential, namely, a half of the voltage applied to the bit line in writing "H", during the bit line equalizing period.

7 Claims, 4 Drawing Sheets

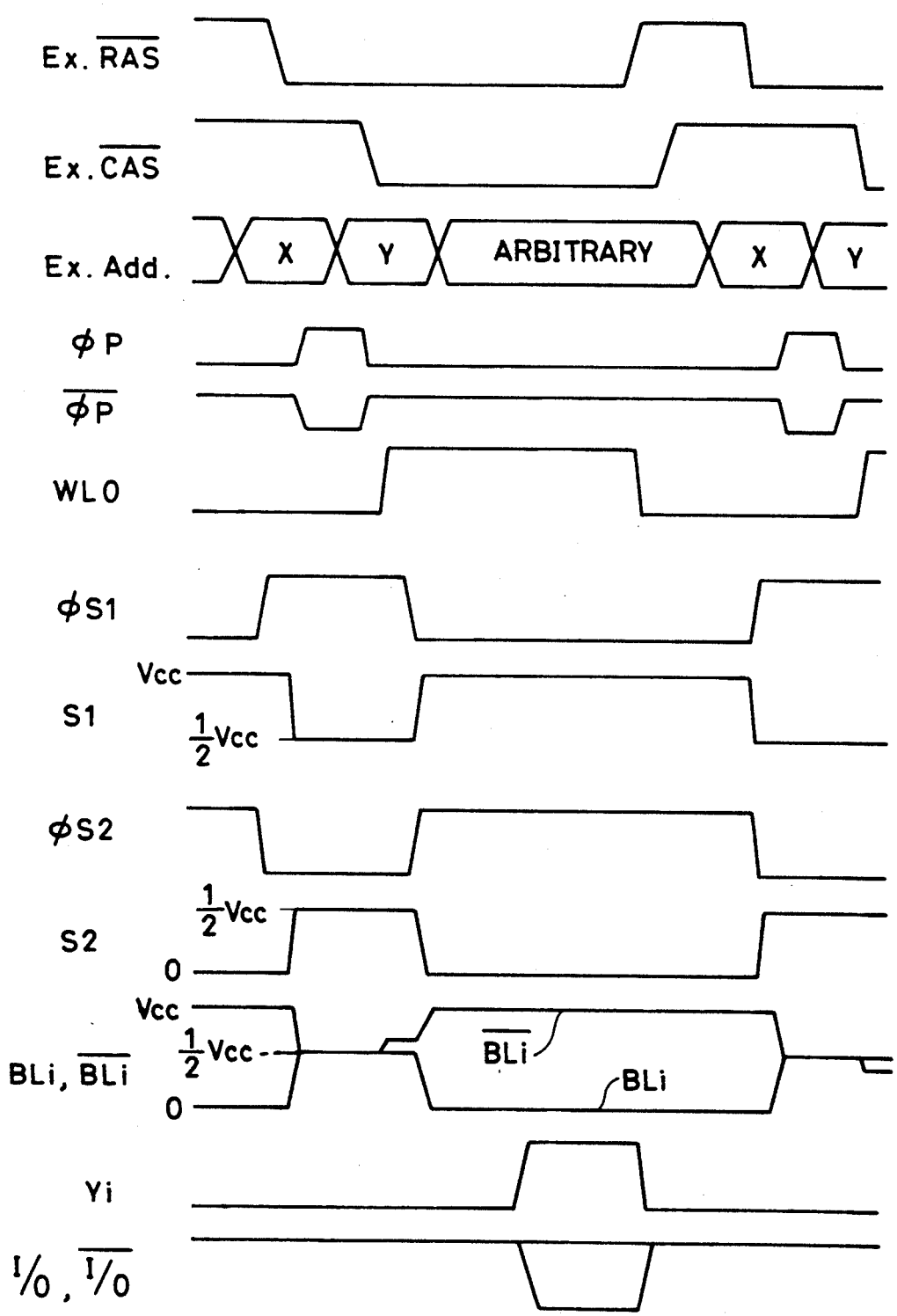

DYNAMIC RANDOM ACCESS MEMORY AND METHOD FOR EQUALIZING SENSE AMPLIFIER DRIVE SIGNAL LINES

This application is a continuation of application Ser. No. 06/924,564, filed Oct. 28, 1986, now abandoned. 18.4, February 1984, pp. 278-287.

BACKGROUND OF THE INVENTION

1. Field of the Invention

The present invention relates to a dynamic random access memory and, more particularly, it relates to a dynamic random access memory having a sense amplifier of a high sensitivity CMOS (complementary MOS) system which is not susceptible to deviations of various parameters during the fabricating process and internally generated noise.

2. Prior Art

FIG. 1 shows a schematic construction of a conventional dynamic random access memory (DRAM), which is disclosed in, for example, A Sub 100ns 256K DRAM in CMOS III Technology, by Roger I. Kung et al, IEEE International Solid-State Circuits Conference, Session XVIII, FAM 18.4, February 1984, pp. 278-287. In the figure, however, only a connection for the i-th bit line pair BLi and $\overline{BLi}$ is shown.

Referring to FIG. 1, the DRAM comprises word lines WL0-WLn for selecting memory cells arranged in a row, a bit line pair BLi and $\overline{BLi}$ of folded bit line type for selecting memory cells arranged in a column, an equalizing transistor 4i which turns on in response to an equalizing signal $\phi$p for connecting the bit lines BLi and $\overline{BLi}$ to be at equal potential, transfer gate transistors 6i1 and 6i2 which turn on in response to a Y decoder (not shown) output Yi for connecting the bit lines $\overline{BLi}$ and BLi to I/O lines 91 and 92, respectively, a sense amplifier 10 which is activated in response to a sense amplifier driving signal S1 for raising the bit line potential of the bit line having a higher potential in the bit line pair further to the $V_{CC}$ level and, a sense amplifier 11 which is activated in response to a sense amplifier driving signal S2 for lowering the bit line potential of the bit line having a lower potential in the bit line pair to the ground level $V_{SS}$.

Memory cells are connected to the bit lines BLi and $\overline{BLi}$, respectively, on every other word line. In the figure, a memory cell formed of a memory transistor 2i0 and a memory capacitor 3i0 for transmitting and receiving information to and from the bit line $\overline{BLi}$ when selected by the word line WL0 and, a memory cell formed of a memory transistor 2in and a memory capacitor 3in for transmitting and receiving information to and from the bit line BLi when selected by the word line WLn are shown.

The sense amplifier 10 comprises a p channel MOS transistor 1i1 having its drain connected to the bit line BLi, its source connected to the sense amplifier driving signal line 12 and its gate connected to the bit line $\overline{BLi}$ and, a p channel MOS transistor 1i2 having its drain connected to the bit line $\overline{BLi}$, its source connected to the driving signal line 12 and its gate connected to the bit line BLi.

The sense amplifier 11 comprises a n channel MOS transistor 5i1 having its drain connected to the bit line BLi, its source connected to the sense amplifier driving signal line 13 and its gate connected to the bit line $\overline{BLi}$ and, an n channel MOS transistor 5i2 having its drain connected to the bit line $\overline{BLi}$, its source connected to the driving signal line 13 and its gate connected to the bit line BLi.

The sense amplifiers 10 and 11 are generally arranged at either ends of the bit line pair BLi and $\overline{BLi}$. This is because it is difficult to provide the p channel MOS transistor and the n channel MOS transistor together in a single layout pitch for the sense amplifier.

The sense amplifier driving signal S1 is generated by a p channel MOS transistor 71 which turns on in response to a control signal $\phi$S1 for connecting the signal line 12 to the supply potential $V_{CC}$.

The sense amplifier driving signal S2 is generated by an n channel MOS transistor 72 which turns on in response to a driving signal $\phi$S2 for connecting the signal line 13 to the ground potential $V_{SS}$.

FIG. 2 is a diagram of waveforms showing the operation timing of the DRAM shown in FIG. 1. The sense (information reading) operation of a conventional DRAM will be hereinafter described with reference to FIGS. 1 and 2, for the case of reading information "1" stored in a memory capacitor 3i0 as an example.

Responsive to the fall of the external $\overline{RAS}$ signal (Ex. $\overline{RAS}$), DRAM enters into the activated state. In the activated state, an external address signal (Ex. Add) is latched in the chip responsive to the fall of the external $\overline{RAS}$ signal. At the same time, the control signal $\phi$S1 becomes a high level while the control signal $\phi$S2 becomes a low level. Accordingly, MOS transistors 71 and 72 both turn off and the sense amplifier driving signals S1 and S2 both turn into a high impedance state. Then, an equalize signal $\phi$P becomes a high level to render the equalizing transistor 4i conductive and the potentials of the bit lines $\overline{BLi}$ and BLi become ($\frac{1}{2}$)·$V_{CC}$ level, that is, precisely the mid point of the supply voltage $V_{CC}$ and the ground voltage $V_{SS}$ which are amplified in the preceding cycle. Accordingly, the potential of the sense amplifier driving signal S1 becomes ($\frac{1}{2}$)·$V_{CC}$ + |Vth(P)| level while the potential of the sense amplifier driving signal S2 becomes ($\frac{1}{2}$)·$V_{CC}$ − |$V_{th}$(N)| level. Here, $V_{th}$(P) is the threshold voltage of the p channel MOSFET while $V_{th}$(N) is the threshold voltage of the n channel MOSFET. After the completion of the bit line equalization, the equalizing signal $\phi$P becomes a low level. Then the potential of a selected word line rises in accordance with the X address signal latched in the chip responsive to the fall of the external $\overline{RAS}$ signal. In FIG. 2, the word line WL0 is selected. When the word line WL0 is selected, the n channel MOSFET 2i0 becomes conductive and the charge stored in the capacitor 3i0 is transferred to the bit line $\overline{BLi}$ so that the potential of $\overline{BLi}$ becomes higher than ($\frac{1}{2}$) SM $V_{CC}$. Then, the control signal $\phi$S1 becomes a low level and the control signal $\phi$S2 becomes a high level so that MOS transistors 71 and 72 turn on. Correspondingly, the sense amplifier driving signal S1 becomes a high level and the sense amplifier driving signal S2 becomes a low level to drive the p channel and n channel sense amplifiers 10 and 11, so that the difference between the potential of the bit lines $\overline{BLi}$ and BLi is amplified. Responsive to the fall of the external $\overline{CAS}$ signal (Ex. $\overline{CAS}$), the state of the external address signal latched in the chip becomes Y address signal, which determines the bit line pair for providing a selected information to the exterior of the chip. In the case where the selected bit line pair is $\overline{BLi}$ and BLi, the signal Yi becomes a high level and amplified memory cell data is transferred to the I/O line 90 and I/O line 91 through transfer transistors 6i1 and 6i2.

In a conventional DRAM, the precharge voltage of the sense amplifier driving signal S1 is higher than the equalizing voltage of the bit line only by the threshold voltages of the p channel MOSFETs 1i1 and 1i2 while the precharge voltage of the sense amplifier driving signal S2 is lower than the equalizing voltage of the bit line only by the threshold voltages of the n channel MOSFETs 5i1 and 5i2, as described above.

In this case, there arise problems that the activation of sense amplifiers is unnecessarily quickened due to the noise superimposed on the sense amplifier driving signals and that the deterioration of the sensitivity of sense amplifiers, which is caused by the unevenness in the characteristics of transistors forming the sense amplifiers, is likely to occur, as disclosed in IECE Japan National Conference Preceedings P. 2–205, THPM 439.

The structure of a sense amplifier making equal the potentials of a bit line and a sense amplifier driving signal line which transmits driving signal to a sense amplifier formed of only nMOS transistors in response to an equalizing signal defining the equalizing period is disclosed in M. Yoshimura et al., "A 64 Kbit MOS RAM", ISSCC 78 Digest of Technical Papers PP.148–149, THPM 122, N. Ieda et al., "A 64k MOS RAM Design", 9th Conference on Solid-State Devices (Japan) Digest of Technical Papers, PP.57–63, August 1977 and R. Foss et al., "Simplified Peripheral Circuits for a Marginally Testable 4K RAM", ISSCC 1975, Digest of Technical Papers PP.102–103, THAM 101, 1975.

However, these prior art references do not disclose a sense amplifier of CMOS system.

SUMMARY OF THE INVENTION

The present invention was made to eliminate the above described problems and its object is to obtain a DRAM having a sense amplifier of, CMOS system with high sensitivity which does not depend on the deviation during the manufacturing process or on the internal noise.

The DRAM according to the present invention comprises switching means which, during the bit line equalizing period prior to the start of operation of the first and second sense amplifiers of CMOS system, connects the driving signal lines of the first and second sense amplifiers to each of the bit lines of the bit line pair and equalizes the potential of each of the bit lines of the bit line pair and the potential of the driving signal lines of the first and second sense amplifiers to ½ of the "H" writing voltage of the memory cell information.

In the present invention, since the potential of each of the bit lines of the bit line pair and the potential of the driving signal lines of the first and second sense amplifiers are equalized to ½ of the "H" writing voltage of the memory cell information during the bit line equalizing period, the voltage between the source and the gate of the n channel MOSFET in the second sense amplifier becomes 0, whereby the margin of the sense amplifier increases. Therefore, the above described problems that the second sense amplifier operates earlier than the prescribed timing during the bit line equalizing period or the deterioration of the sensitivity thereof, can be prevented.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows a diagram of waveforms showing the operation timing of the sense operation in the dynamic random access memory shown in FIG. 3.

DESCRIPTION OF PREFERRED EMBODIMENTS

One embodiment of the present invention will be hereinafter described with reference to the drawings. Meanwhile, in the description of the embodiment, portions overlapping with the description of the prior art will be omitted appropriately.

Figure 1:
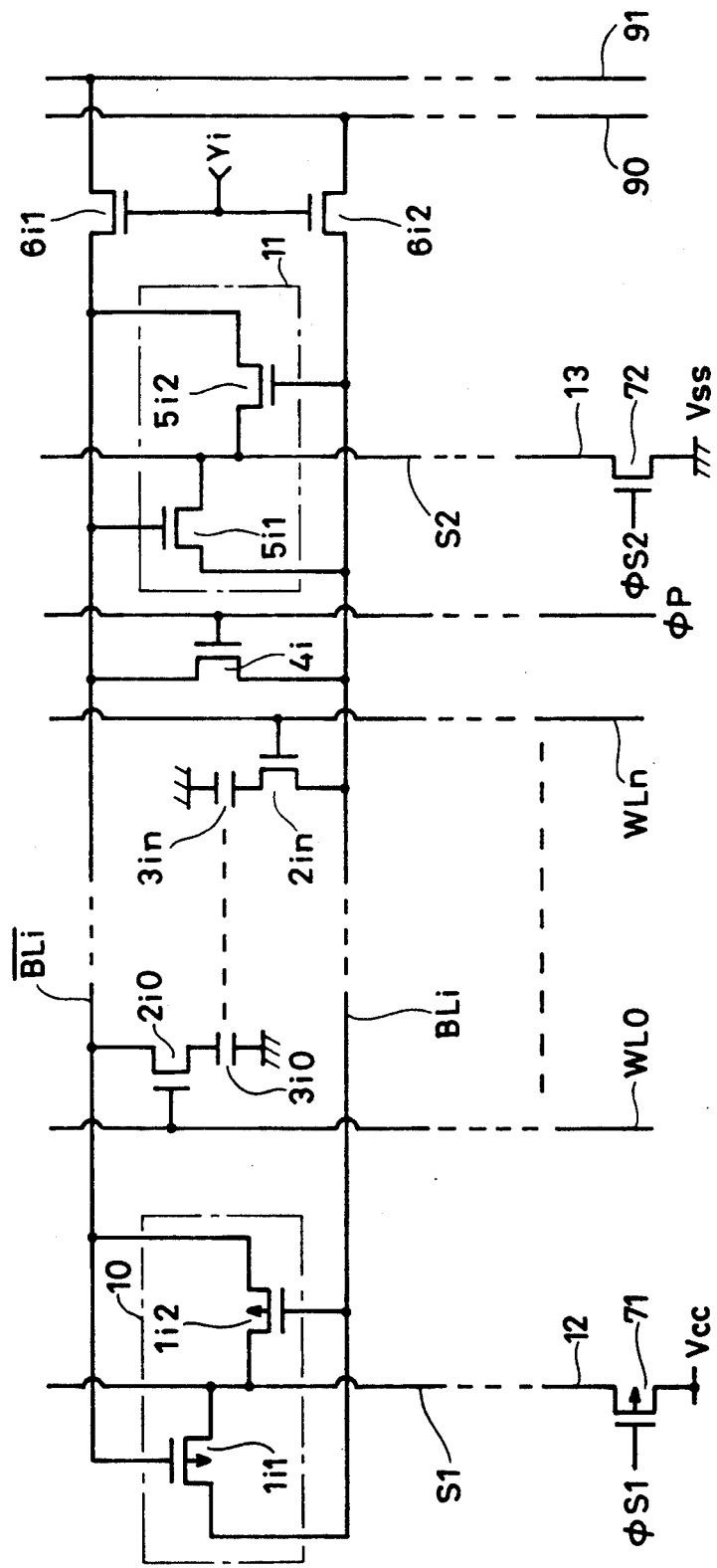
FIG. 1 shows a schematic configuration of a memory cell array portion of a conventional dynamic random access memory.
Figure 2:
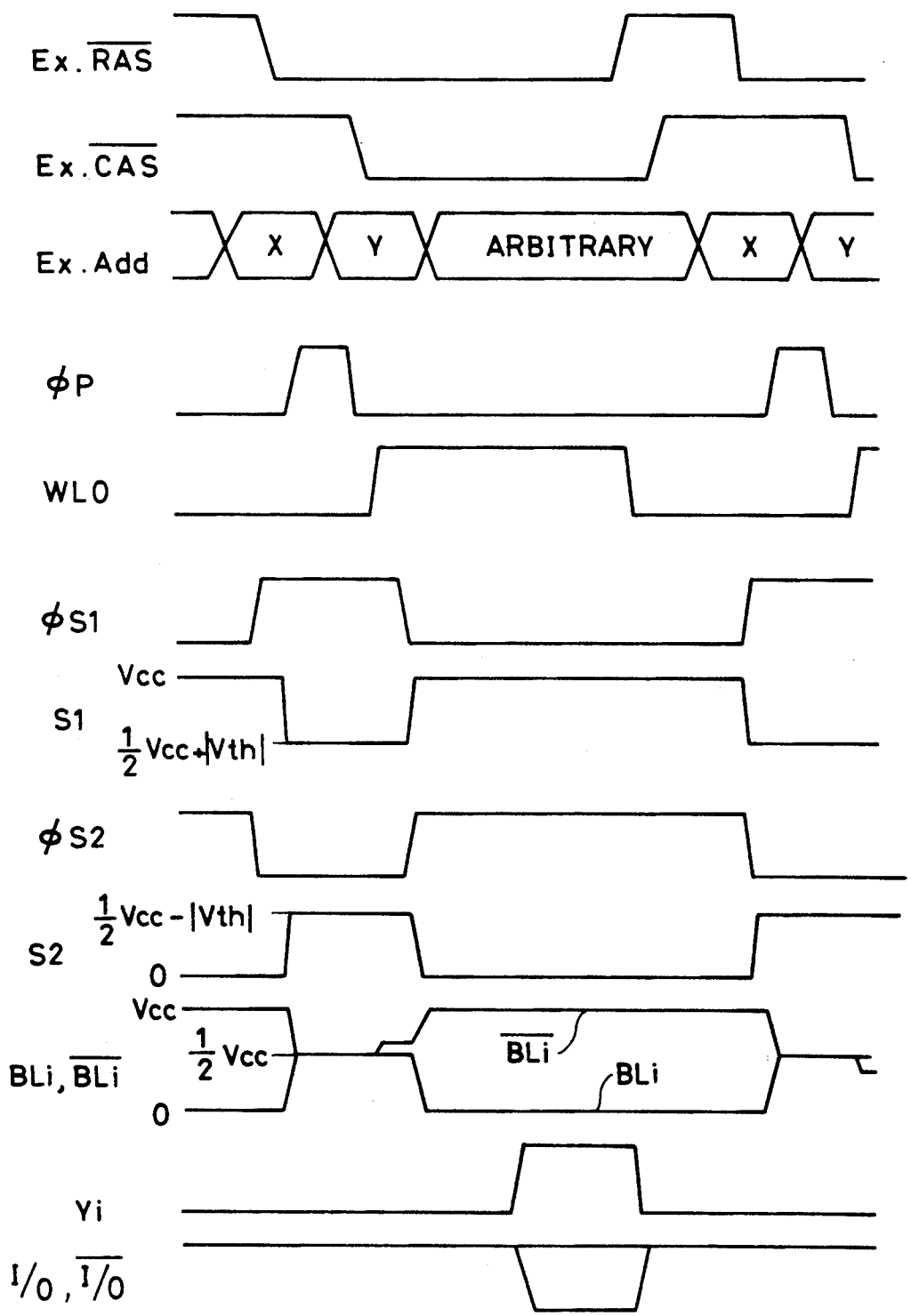
FIG. 2 is a diagram of waveforms showing the operation timing of the sense operation in the dynamic random access memory shown in FIG. 1.
Figure 3:
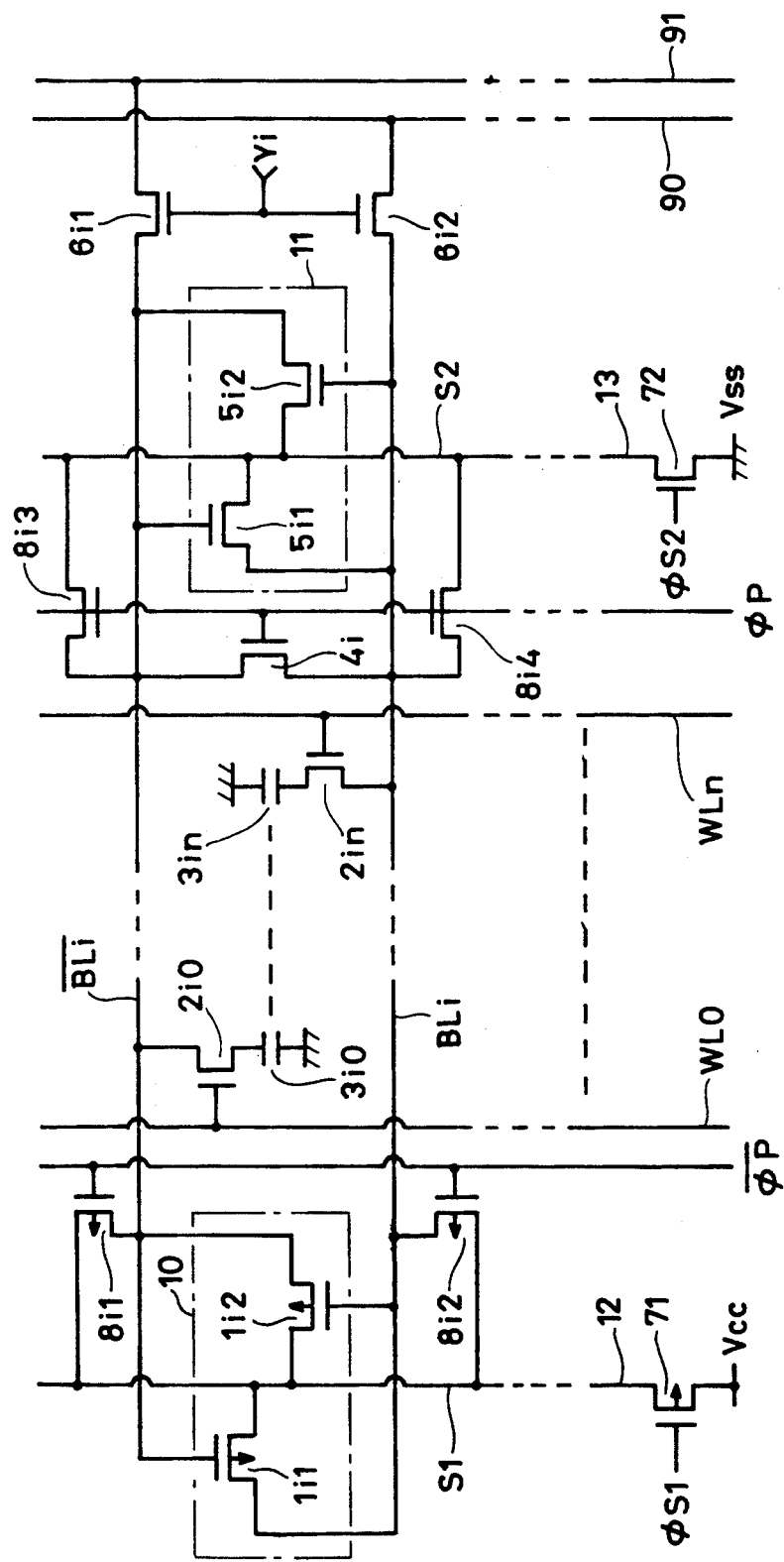
FIG. 3 shows a schematic configuration of a memory cell array portion of a dynamic random access memory according to one embodiment of the present invention.

FIG. 3 shows a schematic configuration of the memory cell array portion in the dynamic random access memory according to one embodiment of the present invention. In FIG. 3, the same or corresponding portions with FIG. 1 are designated by the same reference numerals.

In FIG. 3, the DRAM according to the present invention comprises switching means for setting the bit line potential and the potential of the signal line for driving a sense amplifier connected to that bit line at a half of the potential applied to the bit line connected to the memory cell upon writing "H"("1") in that memory cell (hereinafter referred to as "H" writing voltage).

The switching means comprises a p channel MOS transistor (transfer gate transistor) 8i1 having a gate for receiving inverted equalizing signal $\bar{\phi}p$, one conduction terminal connected to the bit line $\overline{BL}i$ and the other conduction terminal for receiving a sense amplifier driving signal S1 through the signal line 12, a p channel MOS transistor (transfer gate) 8i2 having a gate for receiving the inverted equalizing signal $\bar{\phi}p$, one conduction terminal connected to the bit line BLi and the other conduction terminal for receiving the sense amplifier driving signal S1 through the signal line 12, an n-channel MOS transistor (transfer gate) 8i3 having a gate receiving the equalizing signal $\phi p$, one conduction terminal connected to the bit line $\overline{BL}i$ and the other conduction terminal for receiving the sense amplifier driving signal S2 through the signal line 13 and an n channel MOS transistor (transfer gate) 8i4 having a gate for receiving the equalizing signal $\phi p$, one conduction terminal connected to the bit line BLi and the other conduction terminal for receiving the sense amplifier driving signal S2 through the signal line 13. The p channel MOS transistors 8i1 and 8i2 are provided for the sense amplifier 10 formed of p channel MOS transistors. On the other hand, the n channel MOS transistors 8i3 and 8i4 are provided for the sense amplifier 11 formed of n channel MOS transistors.

The capacitance with respect to the ground of each of the bit lines BLi and $\overline{BL}i$ and the sense amplifier driving signal lines 12 and 13 is designed to be equal to each other. Except that, other structure is the same as the DRAM shown if FIG. 1.

FIG. 4 is a diagram of waveforms showing the operation timing of the sensing by the DRAM shown in FIG. 3. The sensing operation of the DRAM according to the present invention will be hereinafter described with reference to FIGS. 3 and 4.

The bit line equalization starts after the sense amplifier driving signals S1 and S2 both become high impedance state. Namely, the equalizing signal $\phi P$ becomes a low level and the equalizing signal $\overline{\phi P}$ becomes a high level so that the equalizing transistor $4i$ and the transfer transistors $8i1$ to $8i4$ become conductive. Accordingly, the bit line $\overline{BLi}$ which was at the level of the supply voltage $V_{CC}$ at the beginning of the bit line equalization, the bit line BLi which was at the level of the ground voltage $V_{SS}$, the driving signal line 12 of the sense amplifier 10 which was at the level of the supply voltage $V_{CC}$ and the driving signal line 13 of the sense amplifier 11 which was at the level of the ground voltage $V_{SS}$ are connected to each other and the charge for charging and boosting the sense amplifier driving signal S2 and the bit line BLi is fed from the sense amplifier driving signal S1 and the bit line $\overline{BLi}$, whereby the potential of the bit lines $\overline{BLi}$ and BLi and the sense amplifier driving signals S1 and S2 (or signal lines 12 and 13) are equalized. On this occasion, since the capacitance of each of the bit lines $\overline{BLi}$ and BLi and driving signal lines 12 and 13 in relation to the ground is equal to each other, the supply voltage $V_{CC}$ of the bit line $\overline{BLi}$, the ground voltage $V_{SS}$ of the bit line BLi, the supply voltage $V_{CC}$ of the sense amplifier driving signal S1 and the ground voltage $V_{SS}$ of the sense amplifier driving signal S2 are mixed, so that the equalizing voltage becomes a half of the supply voltage $V_{CC}$. Therefore, during the bit line equalizing period, the voltage between the gate and source of each of the n channel MOSFETs $5i1$ and $5i2$ is kept at 0V and, even after the bit line equalizing period, the sense amplifier driving signal S2 is charged to a voltage higher than the conventional DRAM by the threshold voltage of the n channel MOSFETs $5i1$ and $5i2$. In the conventional DRAM, the potential of the sense amplifier driving signal S2 only becomes $(\frac{1}{2}) \cdot V_{CC} - |V_{th}|$ during the bit line equalizing period. Consequently, if the substrate potential lowers due to the influence of internal noise and if the potential of the sense amplifier driving signal S2 happens to lower through the depletion layer capacitance between the diffused region of the sense amplifier 11 and the substrate, then the voltage between the gate and source of each of the n channel MOSFET $5i1$ and $5i2$ readily becomes higher than the threshold voltage, causing a risk that the sense amplifier 11 starts its operation earlier than the prescribed timing. However, in the present invention, there is a margin of the aforementioned threshold voltage in the voltage between the gate and source of the n channel MOSFETs $5i1$ and $5i2$ of the sense amplifier 11, so that the possibility of the voltage between the source and gate of these transistors becoming higher than the threshold voltage due to the internal noise etc. is decreased, whereby the sense amplifier 11 is prevented from operating earlier than the presecribed timing. According to the present invention, since the same voltage is always applied across the source and gate of the n channel MOSFETs $5i1$ and $5i2$, even if their characteristics of these transistors are uneven due to the deviation in the manufacturing process, the resulting error of the operation timing or the deterioration of the sensitivity of the sense amplifier 11 can be prevented.

Since the potentials of the bit lines $\overline{BLi}$ and BLi are thus equalized at $(\frac{1}{2}) \cdot V_{CC}$, when the equalizing signal $\phi P$ rises, the equalizing signal $\overline{\phi P}$ falls and the potential of the selected word line WL0 rises to connect the capacitor $3i0$ to the bit line $\overline{BLi}$ subsequently, the amount of change in the potential of the bit line $\overline{BLi}$ is equalized both in reading "H" and "L", whereby the operation of the sense amplifier becomes advantageous. In addition, since the n MOSFET $2i0$ in the memory cell operates in the tri-pole area, namely, the potential of the word line WL0 rises to $V_{CC}$ after the bit lines $\overline{BLi}$ and BLi are equalized to $(\frac{1}{2}) \cdot V_{CC}$ and the information is read out from the memory cell, enough voltage is applied between the source and gate of the MOS transistor $2i0$, enabling fast reading operation. Thereafter, the control signal $\phi S1$ becomes a low level and the control signal $\phi S2$ becomes a high level to drive the sense amplifiers 10 and 11 and thus the following information sensing operation continues.

Although an n channel MOSFET is used for the equalizing transistor $4i$ in the above described embodiment, a p channel MOSFET may be used and be driven by a control signal $\phi P$.

A DRAM having MOSFETs with opposite channel type to the DRAM shown in FIG. 3 may provide the same effect as the above described embodiment.

As is apparent from the foregoing, according to the present invention, a switching means connects the driving signal lines of the first sense amplifier formed of p channel MOSFETs and the second sense amplifier formed of n channel MOSFETs to each of the bit lines of a bit line pair so as to equalize the potential of each of the bit lines of the bit line pair and the potential of the driving signal lines of the first and second sense amplifiers to a half of the "H" writing voltage of the memory cell during the bit line equalizing period, so that a margin is ensured for the second sense amplifier against the internal noise or against the deviation of the transistor characteristics dependent on the manufacturing process, whereby the second sense amplifier is prevented from operating earlier than the prescribed timing due to the deviation of the substrate potential during the DRAM operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory (DRAM) comprising;
   a memory cell array formed of a plurality of memory cells arranged in a matrix form of rows and columns and each of which cells stores information;
   a plurality of word lines for selecting one of said rows from said memory cell array;
   a plurality of bit lines for selecting one of said columns from said memory cell array, wherein said bit lines form folded bit line pairs;
   equalizing transistors provided for each of said bit line pairs and being activated in response to a first driving signal for equalizing the bit line potential of a bit line pair to which a corresponding equalizing transistor is connected, a writing potential being applied selectively, to particular ones of said bit lines for writing a bit into a corresponding cell of said array;

first sense amplifiers formed of n channel MOS transistors provided for respective ones of said bit line pairs and being activated in response to a second driving signal applied through a first signal line for detecting and amplifying the difference of the bit line potentials of the bit line pair to which the amplifier is connected, wherein said second driving signal is generated at a timing after said first driving signal;

second sense amplifiers formed of p channel MOS transistors provided for respective ones of said bit line pairs and being activated in response to a third driving signal applied through a second signal line for detecting and amplifying the difference in potentials of the bit lines of the bit line pair to which the amplifier is connected;

said bit lines and said signal lines having selected capacitances to ground associated therewith;

wherein said DRAM further comprises switching means including transistors connected respectively between said bit line pairs and said first and second signal lines and being activated in response to said first driving signal for setting said bit line pairs and said signal lines at a common potential established by said capacitances that is one half of the writing potential of said array.

2. A dynamic random access memory according to claim 1, wherein the capacitances with respect to ground of each bit line of said bit line pairs and said first and second signal lines is made equal to each other.

3. A dynamic random access memory according to claim 1, wherein said switching means comprises two n channel MOS transistors respectively provided between each bit line of the bit line pairs and said first signal line and which turn on in response to said first driving signal, and two p channel MOS transistors respectively provided between each bit line of the bit line pairs and said second signal line and which turn on in response to said first driving signal.

4. In a dynamic random access memory (DRAM) comprising a memory cell array, said memory cell array having rows and columns; a plurality of word lines for selecting one of said rows from said memory cell array; a plurality of bit lines for selecting one of said columns from said memory cell array, said bit lines having selected capacitances and formed in folded bit line pairs; equalizing transistors for each of said bit line pairs, said equalizing transistors activated in response to a first driving signal; a writing potential for writing a bit into a cell of said memory cell array being applied selectively to said bit lines for writing a bit into a corresponding cell of said array; first sense amplifiers formed of n channel MOS transistors provided for a respective one of said bit line pairs, said first sense amplifiers detecting and amplifying the difference of the bit line potentials of the bit line pair to which respective ones of said first sense amplifiers are connected, each said first sense amplifier activated in response to a second driving signal applied through a first signal line and generated at a timing after said first driving signal; second sense amplifiers formed of p channel MOS transistors provided for a respective one of said bit line pairs, said second sense amplifiers detecting and amplifying the difference of the bit line potentials of the bit line pair to which respective ones of said second sense amplifiers are connected, each said second sense amplifier activated in response to a third driving signal applied through a second signal line, said first and second signal lines having selected capacitances; a method of improving the operating margin of said sense amplifiers, comprising the steps of placing said first and second signal lines in a high impedance state, and in response to said first driving signal, connecting said driving signal lines of said sense amplifiers to each bit line of the bit line pairs so as to equalize the potential, due to said capacitances of said bit lines and said first and second signal lines, of each of said bit lines of said bit line pairs of said array at a common potential that is one half said writing potential of said array.

5. A dynamic random access memory comprising:

a plurality of memory cells arranged in a matrix form of rows and columns;

a plurality of word lines arranged in rows, each said word line connected to memory cells arranged in a respective row of said matrix;

a plurality of bit line pairs arranged in columns and having selected capacitances, each said bit line pair connected to memory cells arranged in a respective column of said matrix;

a plurality of equalizing transistors being made conductive at an equalizing period; each equalizing transistor connected between bit lines of a corresponding bit line pair;

a plurality of first sense amplifiers, each said first sense amplifier having first and second n channel MOS transistors, said first n channel MOS transistor of each of said first sense amplifier connected between one bit line of a corresponding bit line pair and a first driving signal line having a selected capacitance, the gate electrode of said first n channel MOS transistor connected to the other bit line of said corresponding bit line pair; said second n channel MOS transistor of each said first sense amplifier connected between said other bit line and said first driving signal line; the gate electrode of said second n channel MOS transistor connected to said one bit line of said corresponding bit line pair;

a plurality of second sense amplifiers, each said second sense amplifier having first and second p channel MOS transistors, said first p channel MOS transistor of each said second sense amplifier connected between said one bit line of a corresponding bit line pair and a second driving signal line having a selected capacitance, the gate electrode of said second p channel MOS transistor of each said second sense amplifier connected to said other bit line of said corresponding bit line pair, said second p channel MOS transistor connected between said other bit line of said corresponding bit line pair and said second driving signal line, the gate electrode of said second p channel MOS transistor connected to said one bit line of said corresponding bit line pair;

a plurality of first switching transistors being made conductive at said equalizing period; each first switching transistor connected between said one bit line of a corresponding bit line pair and said first driving signal line;

a plurality of second switching transistors being made conductive at said equalizing period, each second switching transistor connected between the other bit line of a corresponding bit line pair and said first driving signal line;

a plurality of third switching transistors being made conductive at said equalizing period, each third switching transistor connected between said one bit line of a corresponding bit line pair and said second driving signal line; and a plurality of fourth switching transistors being made conductive at said equalizing period, each fourth switching transistor connected between the other bit line of a corresponding bit line pair and said second driving signal line.

6. A memory according to claim 5, wherein said equalizing transistors and said first and second n channel switching transistors are each formed of an n channel MOS transistor, while said third and fourth switching transistors are each formed of p channel MOS transistors.

7. A memory device according to claim 5, wherein each said first and second driving signal line has the same capacitance with respect to ground as that of each bit line of said bit line pairs.

* * * * *